United States Patent
Lee et al.

(10) Patent No.: US 6,892,062 B2
(45) Date of Patent: May 10, 2005

(54) CURRENT-REUSE BLEEDING MIXER

(75) Inventors: Sang Gug Lee, Daejeon (KR); Jung-Ki Choi, Daejeon (KR); Nam-Soo Kim, Daejeon (KR)

(73) Assignee: Information and Communications University Educational Foundation, Seoul (KR)

( * ) Notice: Subject to any disclaimer, the term of this patent is extended or adjusted under 35 U.S.C. 154(b) by 716 days.

(21) Appl. No.: 09/828,182

(22) Filed: Apr. 9, 2001

(65) Prior Publication Data

US 2002/0004376 A1 Jan. 10, 2002

(30) Foreign Application Priority Data

Jun. 2, 2000 (KR) ........................................ 2000-30445

(51) Int. Cl.[7] .............................................. H04B 1/26
(52) U.S. Cl. ........................ 455/326; 455/333; 327/113
(58) Field of Search ................................ 455/326, 333; 327/113, 359

(56) References Cited

U.S. PATENT DOCUMENTS 5,933,771 A * 8/1999 Tiller et al. .................. 455/333

* cited by examiner

Primary Examiner—Lee Nguyen
(74) Attorney, Agent, or Firm—Bacon & Thomas, PLLC

(57) ABSTRACT

A current-reusing bleeding mixer capable of providing a higher conversion gain, linearity and lower noise figure employing a field-effect transistor includes a first to a fourth transistor and a first and a second load element. The first transistor amplifies a radio frequency (RF) signal. The second and the third transistor, each connected to the first transistor, receive a balanced local oscillator (LO) signal to mix it with the RF signal. The first and the second load element are connected between a supply voltage source and the second transistor and between the supply voltage source and the third transistor, respectively. The fourth transistor, connected between the supply voltage source and the first transistor, amplifies the RF signal and bleeds a current from the supply voltage source.

7 Claims, 6 Drawing Sheets

CURRENT-REUSE BLEEDING MIXER

FIELD OF THE INVENTION

The present invention relates to a mixer for converting a frequency; and, in particular, to a current-reusing bleeding mixer capable of providing a higher conversion gain and linearity, and a lower noise figure employing field-effect transistors.

DESCRIPTION OF THE PRIOR ART

In recent years, RF IC technologies have evolved ever rapidly together with the exploding consumer wireless communications infrastructure. Ever since the invention of the superheterodyne concept by Armstrong in 1918, mixers have been of critical importance in determining the overall performance of radio receivers, virtually all of which require at least one mixer. Of components comprising a heterodyne radio receiver, a down-conversion mixer is probably the most important block that influences the performance. A down-conversion mixer performance is a dominant factor in a system noise figure and linearity, and determines performance requirements of its adjacent blocks, especially those of a low-noise amplifier.

Mixers can generally be categorized into passive and active mixers. Passive mixers, such as diode mixers and passive field effect transistor (FET) mixers, have no conversion gain. On the other hand, active mixers have conversion gain that acts to reduce the noise contribution from an intermediate frequency (IF) stage. It is the active mixers on which we will concentrate hereinafter.

The majority of the active mixers are based on the "Gilbert cell" well known in the art and some down-conversion mixers choose a single-balanced type configuration. The key specifications of the mixer are the conversion gain, noise figure, and the linearity.

Referring to FIG. 1, there is shown a conventional basic single balanced mixer 10 based on CMOS transistors. The single balanced mixer 10 downconverts a single-ended radio frequency (RF) signal having a predetermined center frequency value ($\omega_{RF}$) to a lower center frequency value ($\omega_{IF}$) by mixing the RF signal with a balanced local oscillator (LO) signal having a positive phase portion LO$^+$ and a balanced local oscillator signal with a negative phase portion LO$^-$.

The single balanced mixer 10 includes load resistors R11 and R12, a differential pair of MOS transistors M12 and M13 as a switching pair and a MOS transistor M11 as a driver stage. The load resistors R11 and R12 are connected to a supply voltage $V_{DD}$ and drains of the pair of transistors M12 and M13, respectively. Each of sources of the pair of transistors M12 and M13 is connected in parallel to a drain of the transistor M11. A source of the transistor M11 is grounded. Intermediate frequency (IF) output terminals IF$^+$ and IF$^-$ are formed between the load resistor R11 and the transistor M12 and between the load resistor R12 and the transistor M13, respectively.

The transistor M11 is operated as a transconductance amplifier and the transistors M12 and M13 perform switching functions. A radio frequency (RF) signal and the balanced LO signals LO$^+$ and LO$^-$ are inputted to a gate of the transistor M11 and respective gates of transistors M12 and M13, respectively. The RF signal inputted to the transistor M11 is amplified and then mixed with the differential LO signals LO+ and LO- applied to the transistors M12 and M13, respectively, to thereby output respective downconverted IF signals at the IF output terminals IF+ and IF-.

Assuming an ideal LO switching at each LO terminal and using a long-channel device expressions for the drain currents, it can be shown that the differential output current of the mixer 10 shown in FIG. 1 is given by Eq. 1 as follows:

$$i_{out,conv} = i^+_{out,conv} - i^-_{out,conv}$$
$$= \frac{4I_{D1}}{\pi}\cos\omega_{LO}t + \frac{2g_{mn1}v_{RF}}{\pi}\cos(\omega_{LO} \pm \omega_{RF})t +$$
higher order terms Eq.1 where $i_{out,conv}$ is the differential output current of the conventional single-balanced mixer 10, $I_{D1}$ and $g_{mn1}$ are a drain current and a transconductance of the transistor M11, respectively, $v_{RF}$ is a voltage amplitude of the RF signal applied to the transistor M11, $\omega_{RF}$ and $\omega_{LO}$ are frequencies of the RF signal and the LO signal, respectively. As shown in Eq. 1, since the output signal IF ($i_{out,conv}$) is generated from the differential signals IF$^+$ and IF$^-$, a frequency component ($\omega_{RF}$) of the RF signal is cancelled in the IF signal. However, a problem rises in which a separate notch or band stop filter is needed to remove the LO component from the IF signal because a frequency component of the LO signal remains, e.g., $$\frac{4I_{D1}}{\pi}\cos\omega_{LO}t.$$

Also, the active mixer linearity tends to be dominantly determined at the driver stage, where the DC bias current plays a major role. For the single-balanced mixer 10 in FIG. 1, the increase in the driver stage current forces a reduction of the load resistance. The driver stage current may be increased to improve the linearity of the mixer 10, and then, however, it is difficult to increase the conversion gain because the conversion gain depends on the load resistors R11, R12 and the transconductance of the MOS transistor M11.

Another prior art mixer design, the so-called double-balanced mixer, typically shown by 20 in FIG. 2, eliminates the need for the band stop filter by using two differential pairs cross-coupled so as to cancel the LO component from the IF output signal. The operation and structure of the double-balanced or "Gilbert" mixer, as it is known in the art, are well known. Although the Gilbert mixer does cancel the LO component in the IF output signal, it does little to improve the basically-nonlinear performance of the single-balanced mixer 10 of FIG. 1. Moreover, the Gilbert mixer requires a matching network at its RF input to achieve low noise.

FIG. 3 and FIG. 4 represent conventional CMOS based single-balanced and double-balanced mixers 30 and 40 with current bleedings $I_{bld}$ as current sources, respectively. The mixers 30 and 40 described above further include bleedings $I_{bld}$ in addition to structures of the single-balanced and the double-balanced mixers 10 and 20 shown in FIGS. 1 and 2, respectively.

The bleedings $I_{bld}$ can allow a higher conversion gain through a higher load resistor as some of the driver stage currents are being steered away from the switching transistors. Furthermore, with bleedings $I_{bld}$, the switching transistors could be operated at a lower gate-source voltage or smaller size transistors could be used. In either case, for a given amount of the LO signal, the bleeding $I_{bld}$ helps to improve the conversion efficiency as the smaller amount of currents are necessary to turn them on and off.

However, the bleeding $I_{bld}$ can degrade the high frequency performance at the driver stage, especially with MOS transistors and/or with too much bleeding. The smaller DC current through the switching transistors reduces the transconductance of them such that the higher impedances are presented at the output of the driver stage. The major down side of the current bleeding is the addition of noise signals, especially with the current source $I_{bld}$ implemented with active devices. The reduction of the transconductance of the switching transistors and the additional noise signals may be factors that increase the noise figure.

Referring to FIG. 5, there is provided a conventional double-balanced mixer 50 with a series connection of a parallel LC tank circuit in addition to the mixer 20 shown in FIG. 2. The LC tank circuit is used to eliminate the addition of the noise signals generated by the bleeding circuit. However, not only can the LC tank circuit increases the die area significantly, but it does not stop many other frequency components of the noise signals down converted to the desired signal.

Therefore, there is a demand for circuit configuration featuring an increased conversion gain and linearity as well as a reduced noise figure in the mixer.

SUMMARY OF THE INVENTION

It is, therefore, an object of the present invention to provide a mixer circuit capable of providing a better performance in conversion gain, linearity, noise figure, and LO isolation.

In accordance with a preferred embodiment of the present invention, there is provided a mixer, comprising:

a first transistor for amplifying a radio frequency (RF) signal;

a second and a third transistor, each connected to the first transistor, for receiving a balanced local oscillator (LO) signal to mix it with the RF signal;

a first and a second load element connected between a supply voltage source and the second transistor and the supply voltage source and the third transistor, respectively; and a fourth transistor, connected between the supply voltage source and the first transistor, for amplifying the RF signal and bleeding a current from the supply voltage source.

In accordance with another preferred embodiment of the present invention, there is provided a mixer, comprising:

a first differential circuit including a first and a second transistor connected differentially to each other, for amplifying a balanced radio frequency (RF) signal;

a second differential circuit including a third and a fourth transistor connected differentially to each other, the third and the fourth transistor being connected to the first and the second transistor, respectively, for receiving a balanced local oscillator (LO) signal to mix it with the balanced RF signal;

a third differential circuit including a fifth and a sixth transistor connected differentially to each other, the fifth and the sixth transistor being connected to the first and the second transistor and cross-coupled to the third and the fourth transistor, respectively, for receiving a balanced local oscillator (LO) signal to mix it with the balanced RF signal;

a first and a second load element connected between a supply voltage source and the third transistor and the supply voltage source and the sixth transistor, respectively; and a fourth circuit including a seventh and an eighth transistor, connected to the supply voltage source and the first differential circuit, for amplifying the RF signal and bleeding a current from the supply voltage source.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 6:
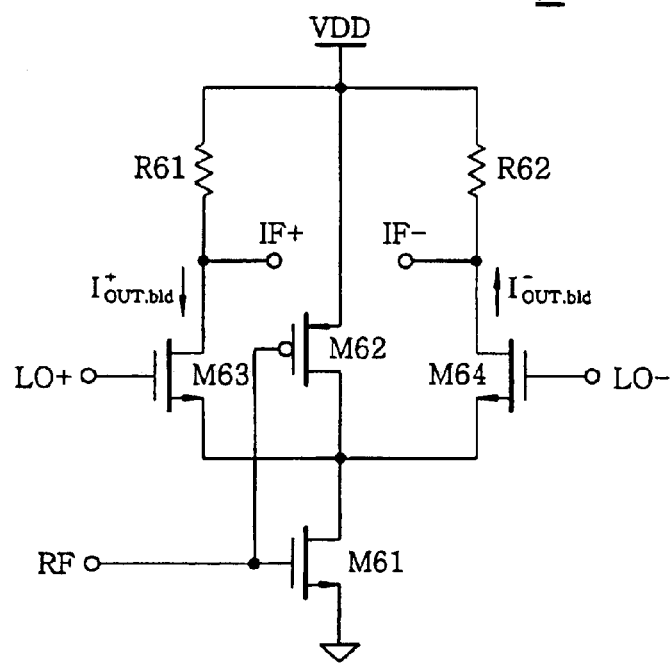
FIG. 6 presents a circuit diagram of a single-balanced mixer with a current-reusing bleeding in accordance with a preferred embodiment of the present invention.

Referring now to FIG. 6, there is provided a current-reusing bleeding single-balanced mixer 60 in accordance with a first preferred embodiment of the present invention. The current-reusing bleeding single-balanced mixer 60 downconverts a single-ended radio frequency (RF) signal having a predetermined center frequency value to a lower center frequency value by mixing the RF signal with a balanced local oscillator (LO) signal having a positive phase portion LO⁺ and with a balanced local oscillator signal having a negative phase portion LO⁻.

The current-reusing bleeding single-balanced mixer 60 includes load resistors R61 and R62, a differential pair of MOS transistors M63 and M64 as a switching pair and a MOS transistor M61 as a driver stage and a current-reusing bleeding MOS transistor M62. The load resistors R61 and R62 are connected to a supply voltage $V_{DD}$ and respective drains of the pair of MOS transistors M63 and M64. Each of sources of the pair of transistors M63 and M64 is connected in parallel to a drain of the transistor M61. A source of the transistor M61 is grounded. A source of the transistor M62 is connected to the $V_{DD}$ and its drain is connected to the sources of the transistors M63 and M64 and the drain of the transistor M61. A gate of the transistor M62 is connected to the gate of the transistor M61 to which RF signal is inputted. Each of the transistors M61, M63 and M64 is an n-channel MOS transistor and the transistor M62 is a p-channel MOS transistor. Intermediate frequency (IF) output terminals IF⁺ and IF⁻ are formed between the load resistor R61 and the transistor M63 and between the load resistor R52 and the transistor M64, respectively.

The transistor M61 is operated as a transconductance amplifier and the transistors M63 and M64 perform switching functions. The transistor M62 is operated as a bleeding current source for DC as well as a transconductace amplifier for AC. A radio frequency (RF) signal and the balanced LO signals LO⁺ and LO⁻ are inputted to a gate of the transistor M61 and M62 and respective gates of transistors M63 and M64, respectively. The RF signal inputted to the transistors M61 and M62 is amplified and then mixed with the differential LO signals LO+ and LO− applied to the transistors M63 and M64, respectively, to thereby output downconverted intermediate frequency (IF) signals at the IF output terminals IF+ and IF−.

Assuming an ideal LO switching and using the long-channel device expressions for the drain currents, it can be shown that the differential output current of the mixer 60 shown in FIG. 6 is given by Eq. 2 as follows:

$$i_{out,bld} = i_{out,bld}^+ - i_{out,bld}^-$$

$$= \frac{4(I_{D61} - I_{D62}) + (\beta_{n61} - \beta_{p62})v_{RF}^2}{\pi}\cos\omega_{LO}t +$$

$$\frac{2(g_{mn61} + g_{mp62})v_{RF}}{\pi}\cos(\omega_{LO} \pm \omega_{RF})t +$$

higher order terms where $i_{out,bld}$ is the differential output current of the current-reusing single-balanced mixer 60, $g_{mn61}$ and $g_{mp62}$ are transconductances of the transistor M61 and M62, respectively, $\beta_{n61}$ and $\beta_{p62}$ are KP·W/L of the transistor M61 and M62, wherein the KP represents the transconductance parameter, and W and L the channel width and length of the MOS transistors, respectively. $v_{RF}$ represents the voltage amplitude of the applied RF signal, $\omega_{LO}$ and $\omega_{RF}$ represent the LO and RF signals frequencies, respectively. $I_{D61}$ and $I_{D62}$ are drain currents of the transistors M61 and M62, respectively.

Figure 2:
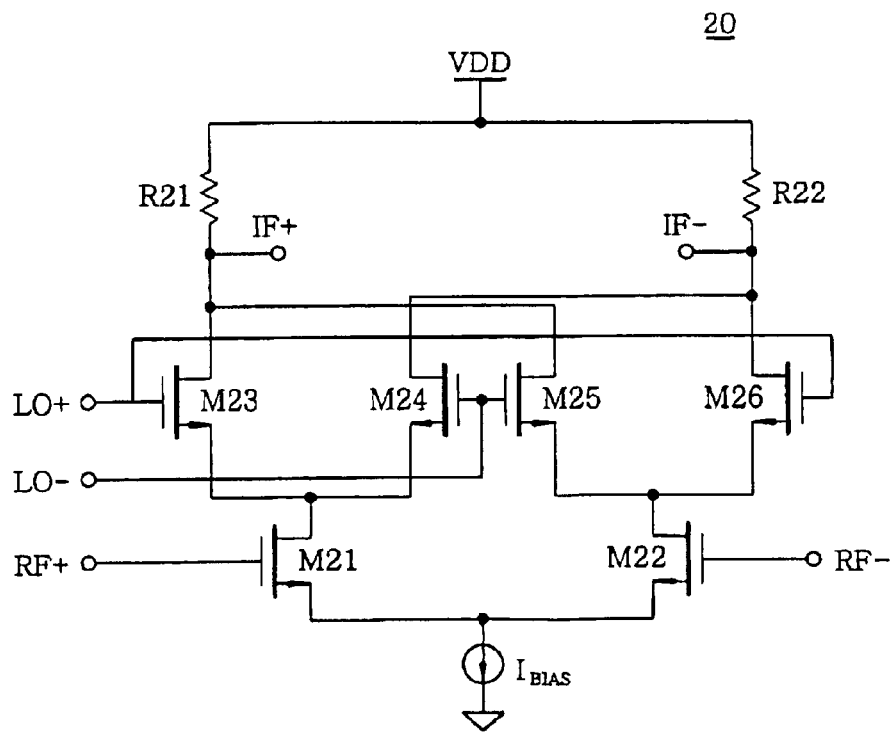
FIG. 2 depicts a circuit diagram of a conventional double-balanced mixer.
Figure 3:
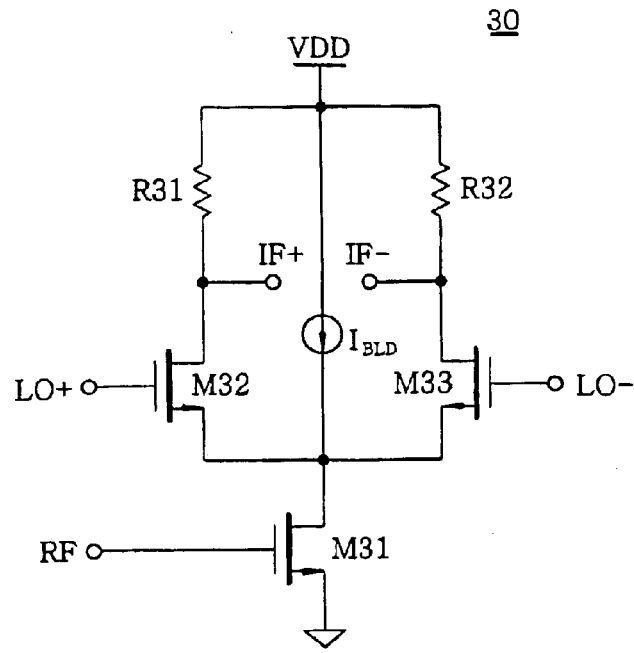
FIG. 3 illustrates a circuit diagram of a conventional single-balanced mixer with a current bleeding.
Figure 4:
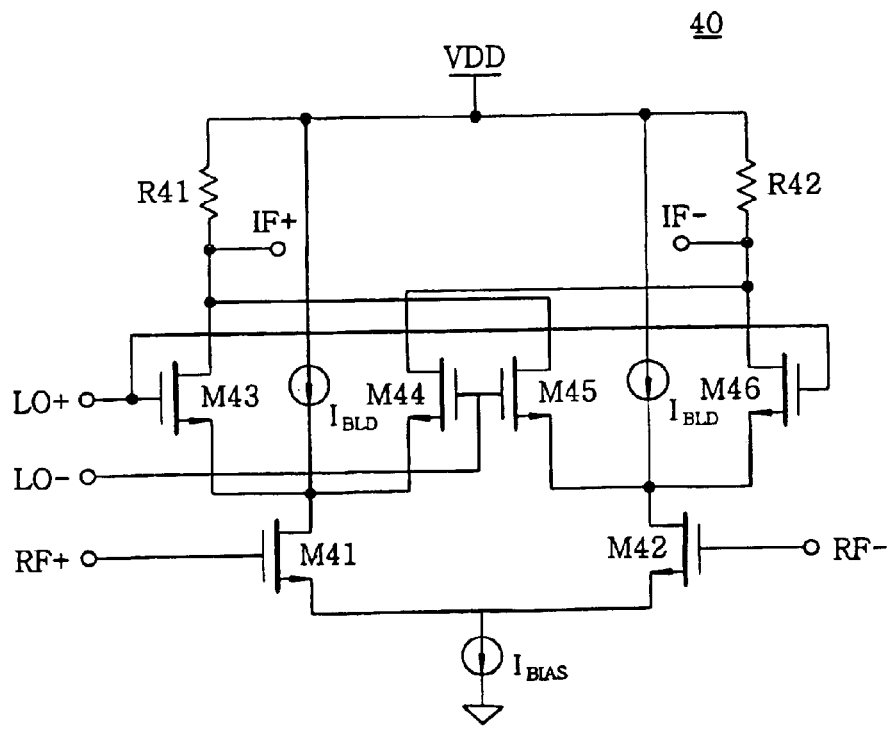
FIG. 4 provides a circuit diagram of a conventional double-balanced mixer with current bleedings.
Figure 5:
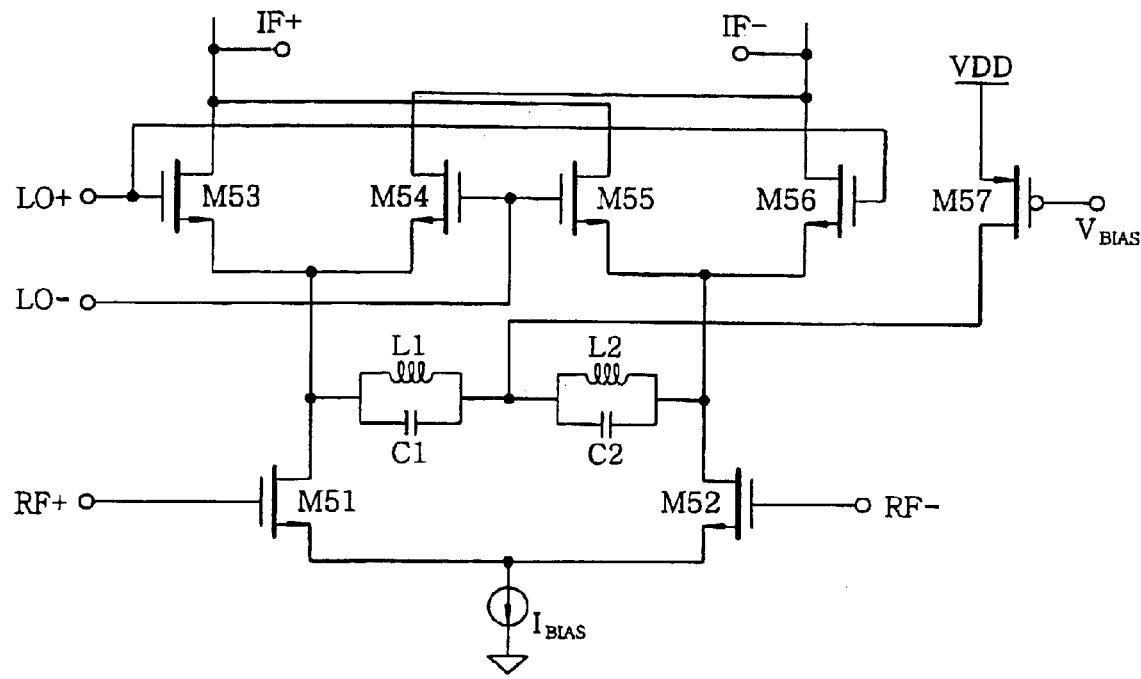
FIG. 5 represents a circuit diagram of a conventional double-balanced mixer with LC tank circuits in addition to the current bleedings.

As shown in Eq. 2, since the IF output signal $i_{out,bld}$ is generated from the differential signals IF+ and IF−, a frequency component of the RF signal is cancelled in the IF signal. Also, the current-reusing bleeding $I_{bld}$ can suppress the LO signal at the IF terminal, in a same way as in the conventional double-balanced mixer 20 of the FIG. 2.

Figure 1:
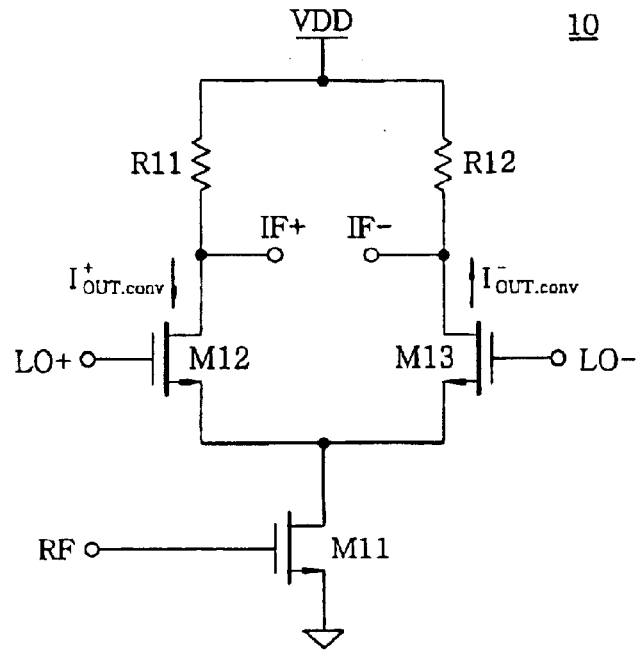
FIG. 1 shows a circuit diagram of a conventional single-balanced mixer.

Furthermore, from Eq. 2, contrary to the conventional mixer 10 shown in FIG. 1, the current-reusing mixer 60 provides complete LO isolation if $4(I_{D1}-I_{D2})+(\beta_{n1}-\beta_{p2})v^2_{RF}=0$. For a small RF signal $V_{RF}$, it is possible to nearly cancel the LO signal at the output by making $I_{D1}=I_{D2}$. For $I_{D1}=I_{D2}$, the switching pair M63 and M64 operate like a passive mixer. Be on the active mixer, generally $I_{D1}>I_{D2}$, therefore a partial cancellation. Even if it may not be a complete cancellation, reducing the LO signal at the output of the single-balanced mixer 60 has a definite advantage because the large LO signal applied to the transistors M63 and M64 tends to push the transistors M63 and M64 into linear operational region.

Comparing the mixers 10 and 60 shown in FIGS. 1 and 6, the effective DC currents of the driver stages are $I_{D11}$ and $I_{D61}+I_{D62}$ (each of M61 and M62 is effectively a single transistor), respectively. Because the increase in the transconductance of the driver stage leads to lower noise figure, for the same overall supply current $I_{D11}=I_{D61}<I_{D61}+I_{D62}$, the noise figure of the proposed mixer 60 is lower than that of the conventional mixer 10. In addition, the input third order intercept point (IP3) of the current-reusing bleeding mixer 60 is expected to be higher than that of the conventional mixer 10 as the IP3 increases with bias current.

A class AB operation of the single-balanced mixer for high P1 dB (1 dB compression point) is introduced in "A Class AB Monolithic Mixer for 900-MHz Applications" IEEE J. Solid-State Circuits, Vol. 32, No. 8, pp. 1166–1172, Aug. 1997. by K. Fong, C. D. Hull and R. G. Meyer. Under class AB operation, the DC current of the driver stage rises with the increase in the RF input power. One additional feature of the current-reusing bleeding mixer 60 is that under the class AB operation of the driver stage, when the DC current through transistor M61 increases, so does the current through transistor M62. Therefore, the amount of bleeding tends to increase by following the increase in the main driver amplifier current $I_{D61}$ to thereby maintain an initial percentage ratio.

Figure 7:
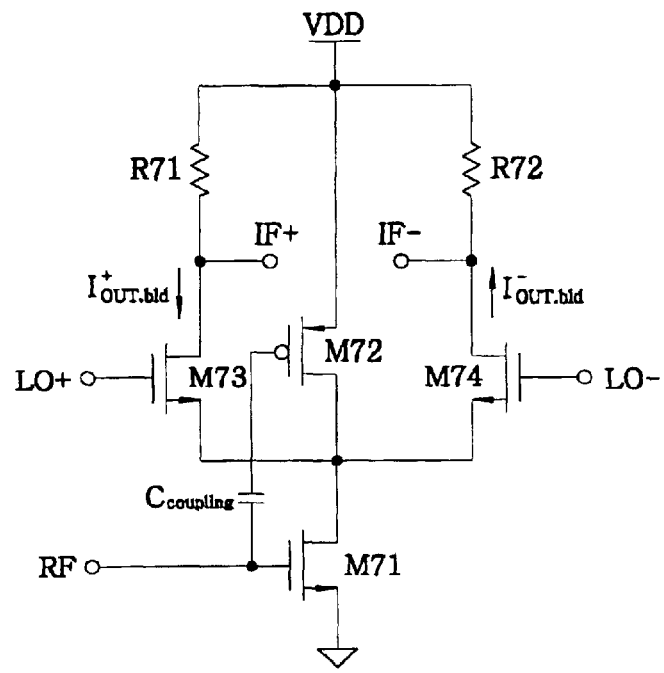
FIG. 7 depicts a circuit diagram of the single-balanced mixer of the FIG. 6 further including a coupling capacitor in accordance with a preferred embodiment of the present invention.

Referring now FIG. 7, there is provided a current-reusing bleeding single-balanced mixer 70 in accordance with a second preferred embodiment of the present invention. The current-reusing bleeding single-balanced mixer 70 further includes a capacitor $C_{coupling}$ in addition to the structures in the current-reusing bleeding single-balanced mixer 60 shown in FIG. 6. The capacitor $C_{coupling}$ is connected between a gate of the transistor M71 and a gate of the transistor M72 and decouples DC contained in the RF signal. Therefore, a predetermined DC voltage can be applied to the gate of the transistor M72 irrespective of the transistor M71. The operation of the mixer 70 is similar to that of the mixer 60 shown in FIG. 6.

Figure 8:
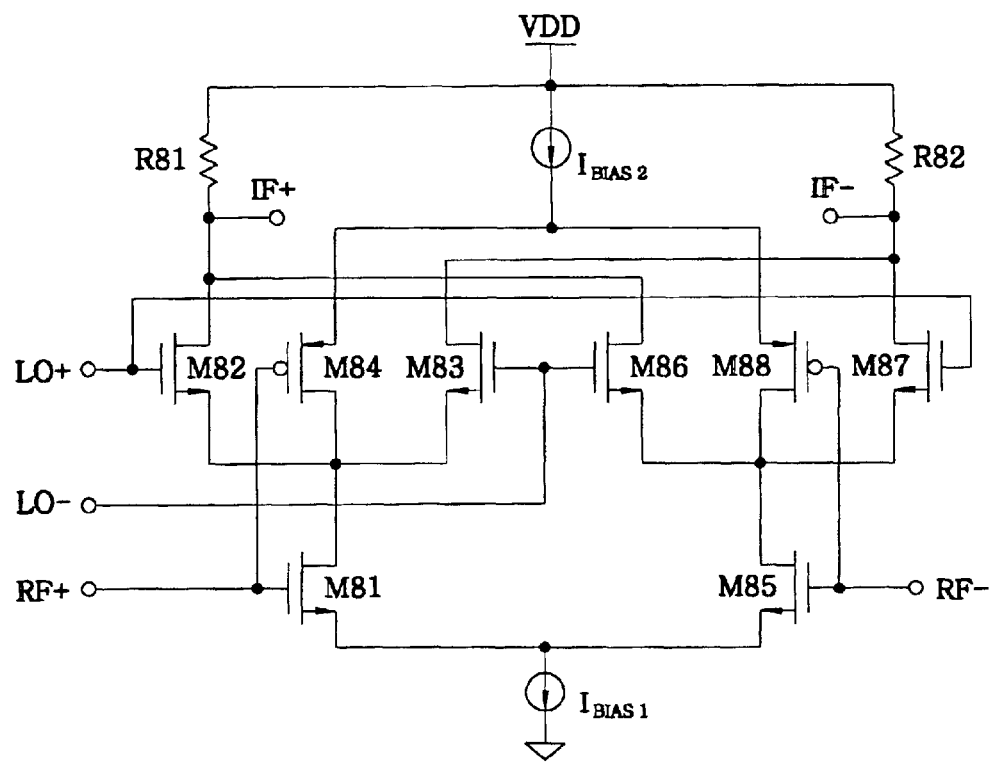
FIG. 8 sets forth a circuit diagram of a double-balanced mixer with current-reusing bleeding in accordance with another embodiment of the present invention.

FIG. 8 represents a current-reusing bleeding double-balanced mixer 80 in accordance with a third preferred embodiment of the present invention. The current-reusing bleeding double-balanced mixer 80 further includes current-reusing bleeding MOS transistors M84 and M88 in addition to a Gilbert mixer as it is well known. Sources of the current-bleeding transistors M84 and M88 are connected to $V_{DD}$ and their drains and gates are connected to drains and gates of driver amplifiers M81 and M85, respectively. Operations of the current-reusing bleeding transistors M84 and M88 are similar to those of current-reusing single-balanced mixer 60 in FIG. 6.

Figure 9:
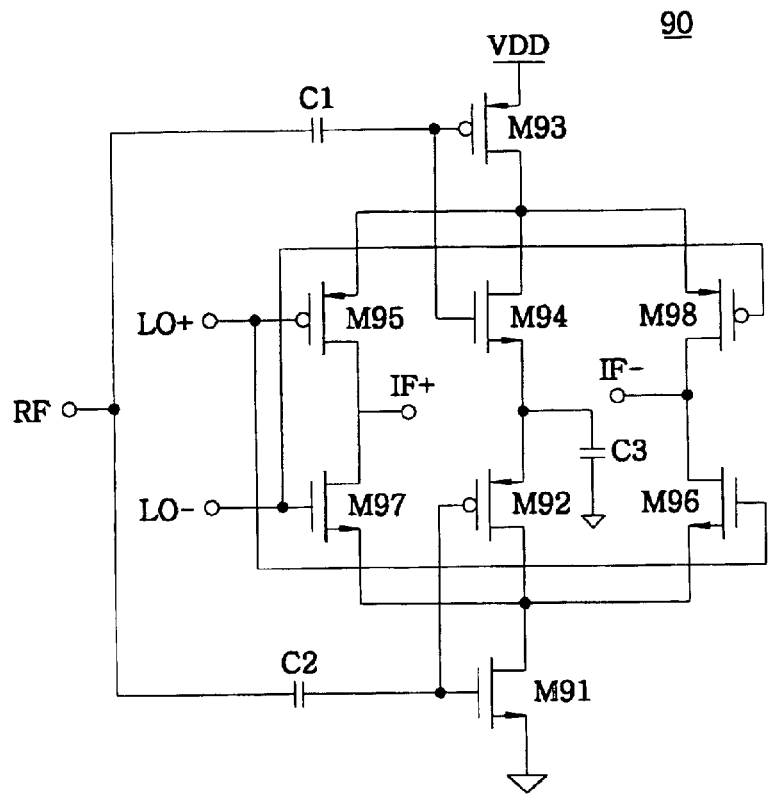
FIG. 9 pictures a circuit diagram of a double-balanced mixer with coupling and bypassing capacitors in accordance with another embodiment of the present invention.

FIG. 9 shows a mixer 90 with current-reusing bleeding transistors M92 and M94 in accordance with a fourth preferred embodiment of the present invention. The mixer 90 further includes current-reusing bleeding MOS transistors M92 and M94 in addition to a mixer described in "A 2.7-v 900-MHz CMOS LNA and Mixer" IEEE J. of Solid-State Circuits, Vol. 31, No. 12, Dec. 1996 by Karanicolas. As shown in FIG. 9, by adding the bleeding transistors M92 and M94, all the merits described above can be achieved. Further, since transistors M91 and M93 are implemented coupled with the transistors M92 and M94, respectively, the circuit in FIG. 9 has a much better symmetry than the circuit proposed by Karanicolas. Still further, since the features of the transistor pairs M91–M92 and M93–M94 get more symmetrical, the improvement of the linearity in an entire drive stage can be expected.

EXAMPLE

Figure 10:
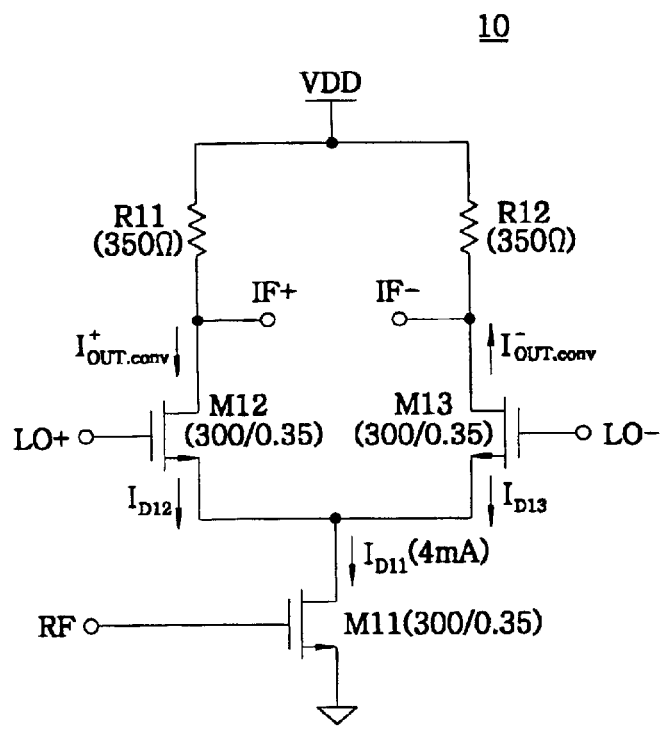
FIG. 10 is a circuit diagram of the conventional single-balanced mixer for simulation.
Figure 11:
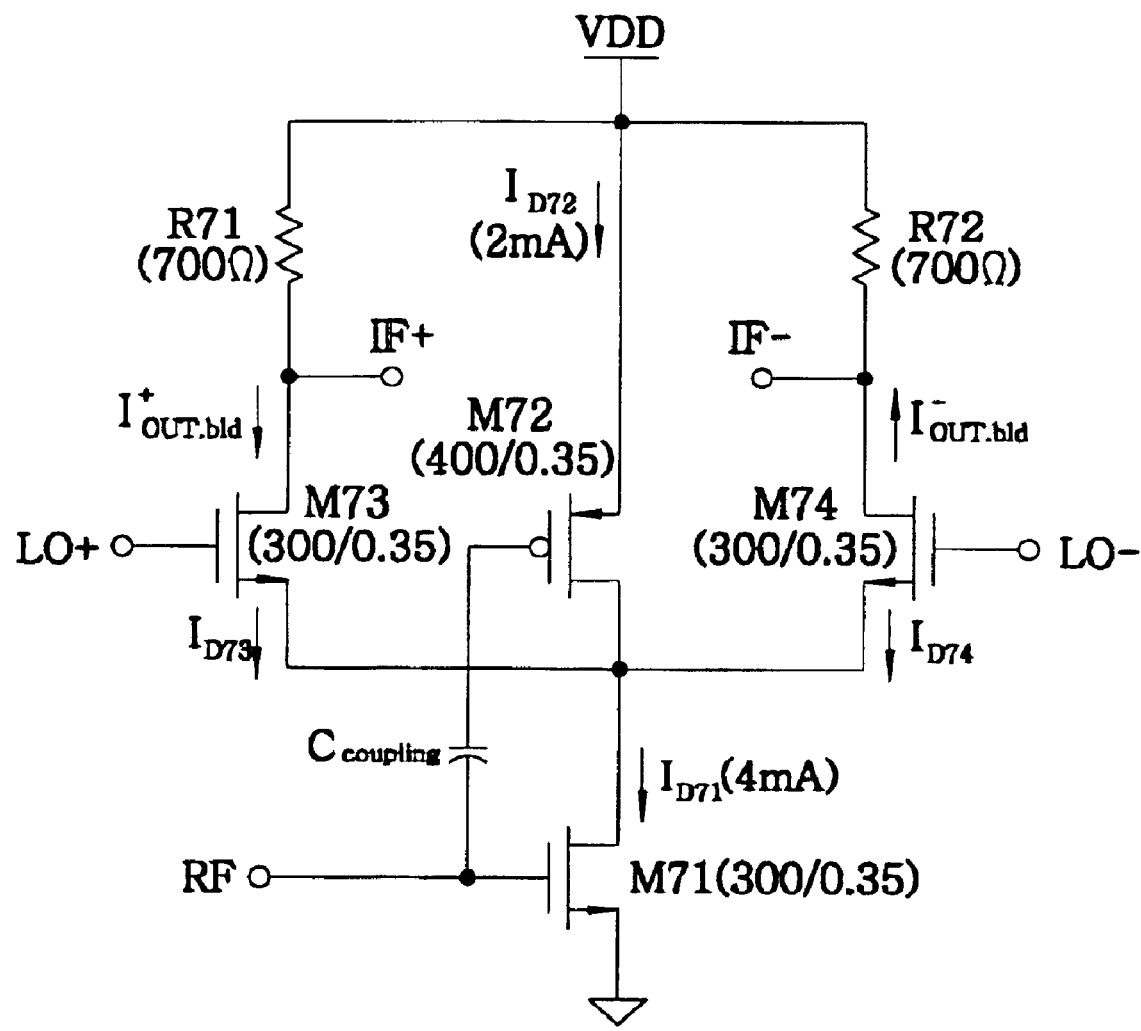
FIG. 11 shows a circuit diagram of the single-balanced mixer for simulation in accordance with the preferred embodiment of the present invention.

FIGS. 10 and 11 are circuit diagrams for simulation to compare the conventional single-balanced mixer 10 to the current-reusing bleeding single-balanced mixer 60. A performance comparison has been carried out between the conventional mixer 10 shown in FIG. 1 and the mixer 60 shown in FIG. 6. The 900 MHz down-conversion mixers are designed by using a 0.35 μm CMOS process. The 300 and 400 μm sizes are used for the n- and p-channel devices, respectively. The details of the bias conditions and the component values are shown in FIGS. 10 and 11 in the parenthesis. For example, M12 (300/0.35) shown in FIG. 10 represents that the MOS transistor M12 is an n-channel device of 300 μm width and 0.35 μm length. Also, M72 (400/0.35) shown in FIG. 11 depicts that the MOS transistor is a p-channel device of 400 μm width and 0.35 μm length. Both circuits are biased to operate at the same DC supply currents and voltages. The bleeding current is adjusted to be 50% of the total current.

Table 1 summarizes the simulation results.

TABLE 1

| Specifications | Conventional mixer | Current-reused bleeding mixer |
| --- | --- | --- |
| Simulation conditions | $f_{RF}$ = 900 MHz, $f_{LO}$ = 1 GHz, LO input power = 0 dBm | |
| Conversion power gain [dB] | 0 | 4 |
| Noise figure [dB] | 12.1 | 11.2 |
| LO power at IF-port [dBm] | −3.6 | −6.9 |
| Output IP3 [dBm] | −4 | −1.6 |

As can be seen from Table 1, the current-reusing bleeding mixer 60 in accordance with the present invention demonstrates 4 dB higher conversion gain, 0.9 dB lower noise figure, 2.4 dB higher IP3, and 3.3 dB lower LO power at the output over that of the conventional mixer.

Without losing the advantages discussed above, the proposed idea can be applied to other types of the mixer topologies including the Gilbert cell type, as well as the up-conversion applications. In fact, the up-conversion mixers are expected to show the advantages more clearly, since the p-channel device performances are more comparable to the n-channel at the significantly lower input frequencies. The proposed idea can be applied to the complimentary bipolar processes as well.

While the invention has been shown and described with respect to the preferred embodiments, it will be understood by those skilled in the art that various changes and modifications may be made without departing from the spirit and scope of the invention as defined in the following claims.

What is claimed is:

1. A mixer, comprising:

a first transistor for amplifying a radio frequency (RE) signal;

a second and a third transistor, each connected to the first transistor, for receiving a balanced local oscillator (LO) signal to mix it with the RF signal;

a first and a second load element connected between a supply voltage source and the second transistor and between the supply voltage source and the third transistor, respectively; and a fourth transistor, connected between the supply voltage source and the first transistor, for amplifying the RE signal and bleeding a current from the supply voltage sources, wherein drains of the second and third transistor are connected to the first and the second load element, respectively, and each source of the second and third transistor is connected in parallel to a drain of the first transistor and a gate and a drain of the fourth transistor are connected to a gate and the drain of the first transistor, respectively.

2. The mixer of claim 1, wherein each of the first, second and third transistor is an N-channel MOSFET and the fourth transistor is a P-channel MOSFET.

3. The mixer of claim 2, further comprising a coupling capacitor between the gates of the first and the fourth transistor.

4. The mixer of claim 3, wherein the first and the second load element are resistors.

5. A mixer, comprising:

a first differential circuit including a first and a second transistor connected differentially to each other, for amplifying a balanced radio frequency (RF) signal;

a second differential circuit including a third transistor and a fourth transistor connected differentially to each other, the third and the fourth transistor being connected to the first and the second transistor, respectively, for receiving a balanced local oscillator (LO) signal to mix it with the balanced RF signal;

a third differential circuit including a fifth and a sixth transistor connected differentially to each other, the fifth and the sixth transistor being connected to the first and the second transistor and cross-coupled to the third and the fourth transistor, respectively, for receiving a balanced local oscillator (LO) signal to mix it with the balanced RF signal;

a first and a second load element connected between a supply voltage source and the third transistor and between the supply voltage source and the sixth transistor, respectively;

a fourth circuit including a seventh and an eighth transistor, connected to the supply voltage source and the first differential circuit, for amplifying the RF signal and bleeding a current from the supply voltage source; and coupling capacitors between the gates of the first and the seventh transistor and the second and the eighth transistor, respectively.

6. The mixer of claim 5, wherein each of the first through the sixth transistor is an N-channel MOSFET and each of the seventh and the eighth transistor is a P-channel MOSFET.

7. The mixer of claim 5, wherein the first and the second load element are resistors.

* * * * *